United States Patent
Chao et al.

(10) Patent No.: US 9,362,453 B2
(45) Date of Patent: Jun. 7, 2016

(54) NEAR-INFRARED LIGHT-EMITTING DIODE AND METHOD FOR MANUFACTURING THE SAME

(71) Applicant: CHUNG YUAN CHRISTIAN UNIVERSITY, Chung Li (TW)

(72) Inventors: Yu-Chiang Chao, Chung Li (TW); Yu-Chi Huang, Chung Li (TW)

(73) Assignee: Chung Yuan Christian University, Chung Li (TW)

( * ) Notice: Subject to any disclaimer, the term of this patent is extended or adjusted under 35 U.S.C. 154(b) by 0 days.

(21) Appl. No.: 14/520,494

(22) Filed: Oct. 22, 2014

(65) Prior Publication Data

US 2016/0056337 A1    Feb. 25, 2016

(30) Foreign Application Priority Data

Aug. 20, 2014   (TW) .............................. 103128520 A

(51) Int. Cl.
| | |
|---|---|
| H01L 33/00 | (2010.01) |
| H01L 33/26 | (2010.01) |
| H01L 31/032 | (2006.01) |
| H01L 21/02 | (2006.01) |
| H01L 31/028 | (2006.01) |
| H01L 31/04 | (2014.01) |

(52) U.S. Cl.
CPC .............. H01L 33/26 (2013.01); H01L 33/005 (2013.01); *H01L 21/02521* (2013.01); *H01L 21/02628* (2013.01); *H01L 31/028* (2013.01); *H01L 31/032* (2013.01); *H01L 31/04* (2013.01); *H01L 2224/45144* (2013.01); *H01L 2224/48463* (2013.01); *H01L 2924/00* (2013.01)

(58) Field of Classification Search
CPC .................. H01L 51/5012; H01L 2251/5361; H01L 27/3202; H01L 27/3204; H01L 27/3225
USPC ......................................................... 257/103
See application file for complete search history.

(56) References Cited

U.S. PATENT DOCUMENTS

| | | | | |
|---|---|---|---|---|
| 6,565,763 | B1 * | 5/2003 | Asakawa ............... | B82Y 10/00 216/22 |
| 8,529,797 | B2 * | 9/2013 | Shum ................ | H01L 21/02381 204/192.1 |
| 2010/0055350 | A1 * | 3/2010 | Pfenninger .......... | C09K 11/616 427/581 |
| 2010/0072374 | A1 * | 3/2010 | Osinski ..................... | C01B 9/06 250/362 |
| 2011/0180757 | A1 * | 7/2011 | Vockic .................. | H01L 31/055 252/301.4 F |
| 2012/0305918 | A1 * | 12/2012 | Shum ................ | H01L 21/02381 257/49 |
| 2012/0306053 | A1 * | 12/2012 | Shum .................. | C04B 35/5152 257/613 |
| 2013/0139872 | A1 * | 6/2013 | Shum ...................... | H01L 31/18 136/252 |
| 2013/0320836 | A1 * | 12/2013 | Kanatzidis ............ | H01L 31/032 313/483 |
| 2014/0054613 | A1 * | 2/2014 | Facchetti ............ | H01L 51/5203 257/79 |

* cited by examiner

*Primary Examiner* — Tod T Van Roy
*Assistant Examiner* — Vu A Vu
(74) *Attorney, Agent, or Firm* — Rosenberg, Klein & Lee

(57) ABSTRACT

The present invention relates generally to a near-infrared light-emitting diode (LED) and the method for manufacturing the same. When preparing the light-emitting layer of the near-infrared LED according to the present invention, the $CsSnXX'_2$ solution is coated on the substrate having the hole transport layer. Then, by a drying process, the solvent is moved away and the $CsSnXX'_2$ solution is solidified, crystallized to $CsSnXX'_2$ in the perovskite structure, which is used as the light-emitting layer of the near-infrared LED and emits near infrared. X and X' are identical or different halogen elements. In addition, according to the present invention, lead can be used to replace a part of tin. By adjusting the ratio of lead and tin or adopting different combination of halogen elements, the wavelength of the generated near infrared varies.

13 Claims, 4 Drawing Sheets

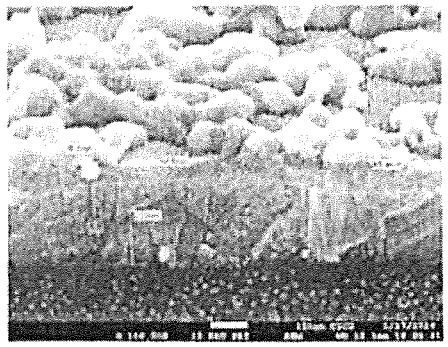 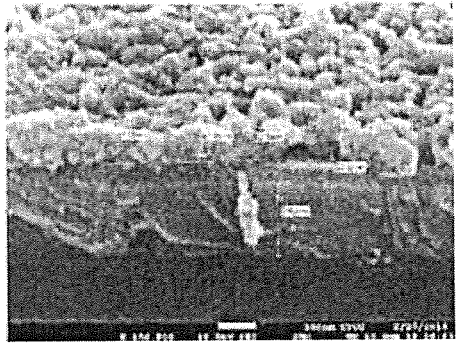
Fig. 4A　　　　　　　　Fig. 4B
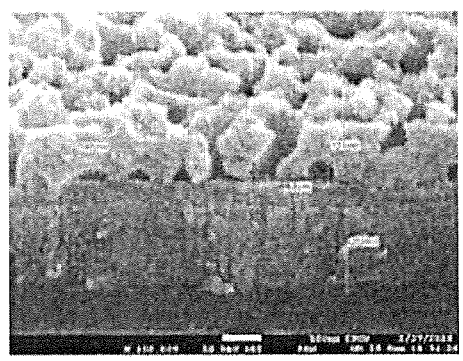
Fig. 4C

NEAR-INFRARED LIGHT-EMITTING DIODE AND METHOD FOR MANUFACTURING THE SAME

FIELD OF THE INVENTION

The present invention relates generally to a light-emitting diode (LED) and the method for manufacturing the same, and particularly to a near-infrared LED capable of emitting near infrared and the method for manufacturing the same, which can be formed by a simple method without using complicated chemical synthesis method or rare element.

BACKGROUND OF THE INVENTION

The near infrared technology plays an important role in defense industries, geological prospecting, optical fiber communication, environmental monitoring, biological imaging, food and drugs, and agricultural inspecting. The key to the development of the near infrared technology lies in the development of materials and the fabrication of light-emitting devices. Due to their small size, low power consumption, high stability, and long lifetime, near-infrared LEDs are critical media for implementing the infrared technology.

Near-infrared LEDs are commonly seen in general applications such as remote controllers and automatic doors of shops. In addition, they are also frequently adopted in transmission and storage of information as well as in the domain of optical fiber communication. Furthermore, in night-vision monitors, near-infrared light sources are applications of near-infrared LEDs. Although the near infrared cannot be sensed by human eyes, it can be captured by cameras or video recorders. Thereby, the near infrared is usually used for supplementing light at night or in places with insufficient brightness, so that monitoring cameras can catch images.

In addition to the night-vision or optical communication applications as described above, near-infrared LEDs can be applied to the biomedical domain. For example, the near infrared emitted by a near-infrared LED can be used to illuminate the skin of a user. Next, a spectrum detector is used for receiving the reflection light, and then the user's blood glucose level can be evaluated after calculations. Thereby, near-infrared LEDs can be applied to a non-invasive blood glucose meter; they can be applied to therapies of skin diseases.

Nonetheless, in the fabrication of near-infrared LEDs, very few of the light-emitting materials are soluble. Moreover, complicated chemical synthesis methods are mostly required, or complicated methods are required for synthesizing quantum dot materials with different diameters, which mostly contains lead and thus against the regulations of environmental protection. Besides, the manufacturing processes mostly require costly vacuum equipment, demanding substantially high fabrication investment.

The China Patent Application Number CN 200780017078.2 disclosed a light-emitting material capable of emitting light in the visible or near-infrared region. The dehydrated $SnI_2$ and CsI are mixed in a standard mold filling machine with the ratio of 1 wt %~99 wt % and ground for 1 to 24 hours. After testing, the ground product can be used as the light-enabled light-emitting material in the near infrared region. The adopted material is a potential material for the light-emitting layer of near-infrared LEDs. Nonetheless, the technology is still immature for application. Further researches are still required on the fabrication method of the light-emitting layer.

Accordingly, owing to the wide applications of near-infrared LEDs and difficulties in fabrication, the present invention provides a novel improvement on the composition of the light-emitting layer of a near-infrared LED and the method for manufacturing the same.

SUMMARY

An objective of the present invention is to provide a method for manufacturing near-infrared LED. After preparing a solution using related materials and coating, drying methods such as draining and baking can be used directly to form a solid-state film as the light-emitting layer. The method is simple and effective.

Another objective of the present invention is to provide a method for manufacturing near-infrared LED. The concentration of the prepared solution can be adjusted by dilution. Thereby, light-emitting layers with different thickness can be formed after drying. This is a novel technique for controlling the property of the light-emitting layer.

Still another objective of the present invention is to provide a method for manufacturing near-infrared LED. A specific solution is prepared and then drained. After solidification and crystallization, the formed light-emitting layer includes the perovskite structure, which is the key point for electron-hole recombination and emitting near infrared with a wavelength between 710 nm and 950.

A further objective of the present invention is to provide a near-infrared LED. The material of the light-emitting layer contains no heavy metal such as mercury, cadmium, chrome, cobalt, nickel, or arsenic. In addition, the lead can be used selectively as the means for adjusting the wavelength of the emitted light, which is beneficial to environmental protection. Moreover, different combinations of halogens can be used for changing the color of the light.

In order to achieve the objectives described above, the present invention discloses a method for manufacturing a near-infrared LED. The method with no lead involved is a typical embodiment. The near-infrared LED comprises a light-emitting layer, which is formed by the following steps. Mix a first powder, a second powder, and a solvent to form $CsSnXX'_2$ solution. The first powder is CsX; the second powder is $SnX'_2$; X and X' are halogen elements. Coat the $CsSnXX'_2$ solution on a substrate. Then, dry and solidify the $CsSnXX'_2$ solution for crystallizing to $CsSnXX'_2$ in the perovskite structure, which is just the light-emitting layer.

BRIEF DESCRIPTION OF THE DRAWINGS

FIGS. 4A~4C show microscopic diagrams of the light-emitting layer according to a preferred embodiment of the present invention, which are used for showing the light-emitting layers formed by $CsSnI_3$ solution in different concentrations after draining and drying.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
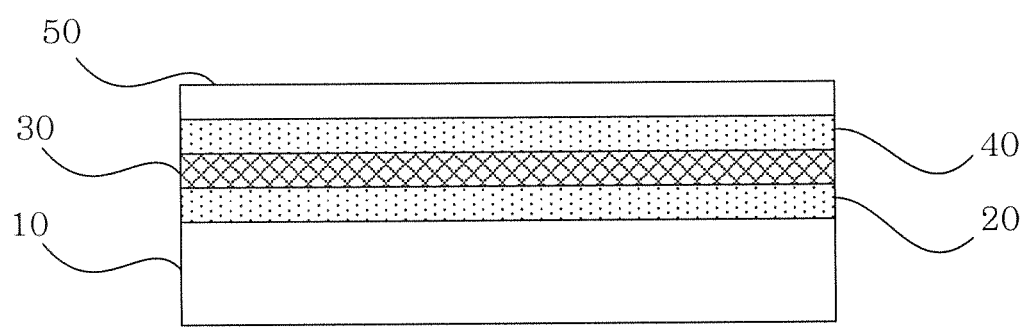
FIG. 1 shows a structural schematic diagram according to a preferred embodiment of the present invention.

Please refer to FIG. 1. The near-infrared LED according to the present invention comprises a substrate 10, a hole transport layer 20, a light-emitting layer 30, an electron transport layer 40, and an electrode layer 50. The hole transport layer 20 is disposed on the substrate 10. The light-emitting layer 30 is disposed on the hole transport layer 20. The electron transport layer is disposed on the light-emitting layer 30. The electrode layer 50 is disposed on the electron transport layer 40.

Based on the above structure, when the near-infrared LED according to the present invention is operating, holes can be injected into the valence band of the material of the light-emitting layer 30 via the hole transport layer 20, and electrons can be injected into the conduction band of the material of the electron transport layer 40 via the electrode layer 50. Because the energy level of the conduction band of the material of the electron transport layer 50 is higher, the electrons in the electron transport layer 40 can be transported to the conduction band of the light-emitting layer 30. When electron-hole recombination occurs in the light-emitting layer 30, because the material is $Cs(Sn_yPb_{1-y})X_{3-z}X'_z$ in the perovskite structure, where X and X' are identical or different halogen elements, $0<y\leq1$ and $0\leq z\leq 3$, if the formed light-emitting layer is $CsSnI_3$, the wavelength of the emitted light is approximately 950 nm. Nonetheless, because the wavelength of the red light emitted by $CsPbI_3$ is approximately 710~720 nm, addition of lead can be adopted for adjusting the color of the light. By controlling the added amount of lead, the wavelength of the light emitted by the near-infrared LED according to the present invention can be adjusted within the range between 710 nm and 950 nm. As more lead is added, the wavelength shifts 710 nm, approaching the lower limit of the wavelength of near infrared. In addition to changing the color of light by using the ratio of tin and lead, according to the present invention, by using different halogen elements or changing the combination of halogen elements, the wavelength of near infrared can be changed, and thus achieving the purpose of adjusting the color of light.

According to the method for manufacturing the near-infrared LED of the present invention, a patterned indium tin oxide (ITO) substrate is prepared first. Because residual oil, dust, photoresist, and water can be left on the surface of the patterned ITO glass substrate during storage and etching processes, before disposing the hole transport layer, the surface should be cleaned first. The cleaning process includes: (1) Immerse the patterned ITO glass substrate into the acetone solvent, place it in an ultrasonic oscillator, and oscillate for 10 minutes. (2) Immerse the substrate in the step (1) into iospropanol, place it in an ultrasonic oscillator, and oscillate for 10 minutes. (3) Immerse the substrate in the step (1) into deionized water, place it in an ultrasonic oscillator, and oscillate for 10 minutes. (4) Take out the substrate, blow it by a nitrogen gun on the workbench of the clean room, place it in an ultraviolet-ozone machine, and expose for 30 minutes. Then subsequent layer coating can be performed.

For forming the hole transport layer on the substrate through spin coating method, the mixture of conductive polymers poly(3,4-ethylenedioxythiophene) (PEDOT) and polystyrene sulfonate (PSS) is coated on the substrate and baked at 120° C. for 20 minutes.

Figure 2:
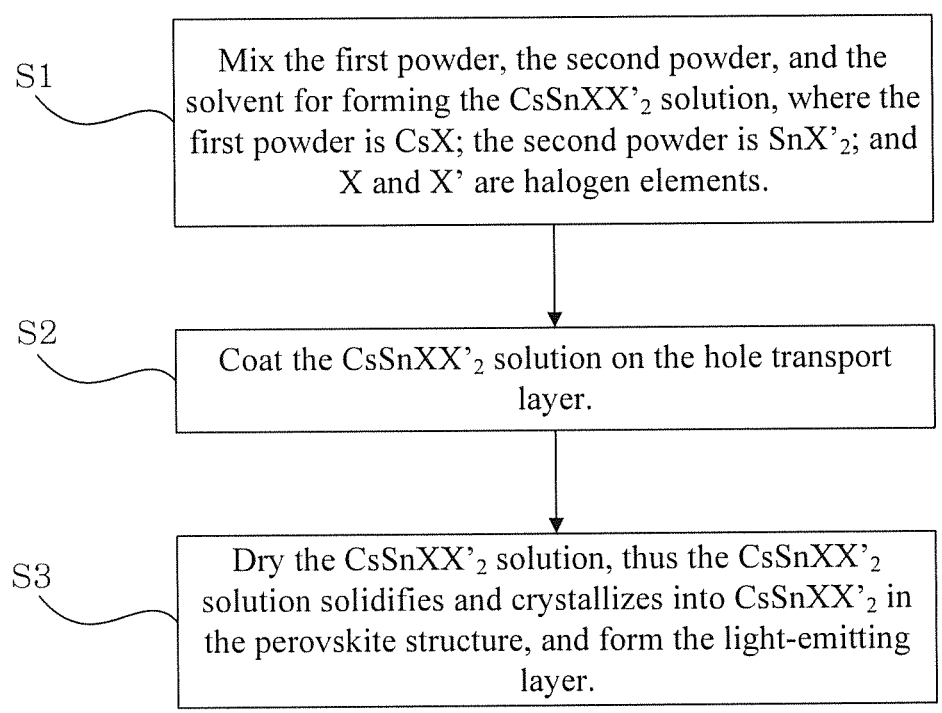
FIG. 2 shows a flowchart according to a preferred embodiment of the present invention.

Next, dispose the hole transport layer on the light-emitting layer. Please refer to FIG. 2. According to the present invention, the lead-free light-emitting layer is used as an example. The method comprises the following steps.

Step S1: Mix the first powder, the second powder, and the solvent for forming the $CsSnXX'_2$ solution, where the first powder is CsX; the second powder is $SnX'_2$; and X and X' are halogen elements.

Step S2: Coat the $CsSnXX'_2$ solution on the hole transport layer.

Step S3: Dry the $CsSnXX'_2$ solution, thus the $CsSnXX'_2$ solution solidifies and crystallizes into $CsSnXX'_2$ in the perovskite structure, and form the light-emitting layer.

According to a preferred embodiment of the present invention, the first powder is CsI and the second powder is $SnI_2$. The amount of CsI is 0.2054 g and that of $SnI_2$ is 0.2946 g. In other words, 0.0008 moles of both are mixed with the solvent. The solvent adopted according to the present invention is a mixture of multiple solvents. The mixture contains methoxy-actonitrile (MOAN), dimethylformamide (DMF), and acetonitrile (AN) in the ratio of 1:3:2. After mixing the first powder, the second powder, and the solvent according to the present embodiment, a $CsSnI_3$ solution with a concentration of 330 mg/ml is given.

According to the previous embodiment, CsI is used as the first powder and $SnI_2$ is used as the second powder. The iodine can be replaced by other halogen elements, such as fluorine, chlorine, bromine, and astatine. On the other hand, tin can be replaced by lead. In addition, both can be adopted at the same time. For example, a portion of the second powder $SnI_2$ is replaced by a third powder $PbI_2$. However, the mole value of the first powder should be kept equal to the sum of the mole values of the second and third powders. Take the same halogen element X for example. As the first powder is CsX, the second powder is $SnX_2$, and the third powder is $PbX_2$, by mixing the first, second, third powders with the solvent, a $Cs(Sn_yPb_{1-y})X_3$ solution is formed, where $0<y<1$. If different halogen elements are uses, for example, the first powder is CsX, the second powder is $SnX_2$ or $SnX'_2$, and the third powder is $PbX_2$ or $PbX'_2$, where X and X' are different halogens, by mixing the first, second, third powders with the solvent, a $Cs(Sn_yPb_{1-y})X_{3-z}X'_z$ solution is formed, where $0<y<1$ and $0<z<2$. No matter forming the $CsSnXX'_2$ solution, the $Cs(Sn_yPb_{1-y})X_3$ solution, or the $Cs(Sn_yPb_{1-y})X_{3-z}X'_z$ solution, the main difference is only that the wavelength of the light emitted by the prepared light-emitting layer in the perovskite structure is different, though all in the near-infrared region. The user can adjust the wavelength by changing the quantity of the added lead.

Figure 3:
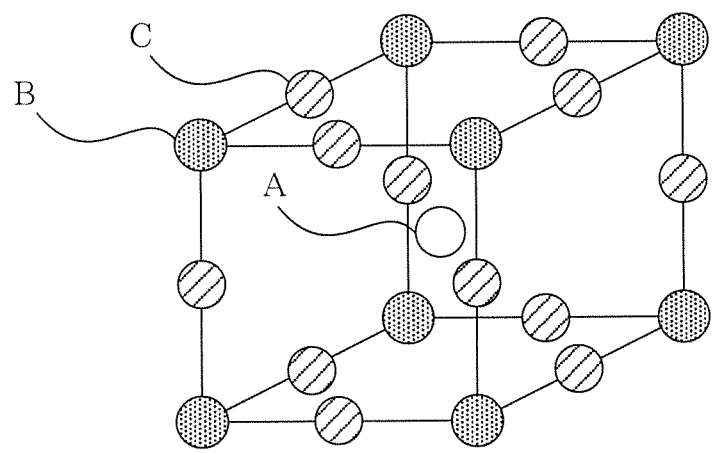
FIG. 3 shows a schematic diagram of the light-emitting layer in the perovskite structure according to a preferred embodiment of the present invention.

After the step S1 and forming the $CsSnXX'_2$ solution (in the following, $CsSnI_3$ solution is used as an example) and before coating on the hole transport layer, the $CsSnI_3$ solution can be diluted first and reducing its concentration to 15~70 mg/ml. Then spin coating (2500~3500 rpm), blade coating, or drop casting can be used for coating the $CsSnI_3$ solution on the hole transport layer uniformly. Next, drying methods such as draining or baking can be used to move the solvent away and solidify the $CsSnI_3$ solution, which crystallize to form $CsSnI_3$ in the perovskite structure, giving the light-emitting layer of the present invention. Please refer to FIG. 3, which shows a schematic diagram of the cubic perovskite structure according to a preferred embodiment of the present invention. The elements A, B, and C represent Cs, Sn, and I, respectively.

Please further refer to FIGS. 4A to 4C, which show microscopic diagrams of coating the $CsSnI_3$ solution on the hole transport layer, where the prepared $CsSnI_3$ solution are diluted to 16.6 mg/ml, 33 mg/ml, and 66 mg/ml before they are coated using drop casting. It is seen that the thickness of the light-emitting layer is influence by the concentration of the CsSnI$_3$ solution after draining.

After forming the CsSnI$_3$ in the perovskite structure as the light-emitting layer, the 2-(4-biphenylyl)-5-(4-tert-butylphenyl)1,3,4-oxadiazole (PBD) solution is spin coated on the light-emitting layer uniformly and acting as the electron transport layer.

Finally, lithium fluoride and aluminum are deposited on the electron transport layer using vapor deposition and used as the electrode layer, which acts as the cathode of the near-infrared LED according to the present invention.

By forming the stack of films following the above steps, the near-infrared LED according to the present invention is produced. The perovskite CsSnI$_3$ or other chemical composition described above is used as the light-emitting layer. Depending on the ratio of the added lead, the recombination of electron-hole pair occurring in the layer can emit near infrared with a wavelength approximately between 701 nm and 950 nm. The near-infrared LED prepared according to the method can be further applied to night vision, optical communication, and biomedical domains. To sum up, the present invention discloses a near-infrared LED and the method for manufacturing the same. Owing to it low-cost nature and ease in controlling the conditions, the present invention undoubtedly provides a near-infrared LED and the method for manufacturing the same with economical and practical values.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A method for manufacturing a near-infrared light-emitting diode comprising a light-emitting layer, characterized in that the formation of said light-emitting layer comprising steps of:
   mixing a first powder, a second powder, and a solvent for forming a CsSnXX'$_2$ solution, said first powder being CsX, said second powder being SnX'$_2$, and X and X' are halogen elements, the solvent is a mixture of methoxyactonitrile, dimethylformamide, and acetonitrile;
   coating said CsSnXX'$_2$ solution on a substrate; and
   drying said CsSnXX'$_2$ solution, and said CsSnXX'$_2$ solution thus solidified and crystallized to CsSnXX'$_2$ in the perovskite structure and forming said light-emitting layer.

2. The method for manufacturing a near-infrared light-emitting diode of claim 1, wherein X and X' are identical halogen element.

3. The method for manufacturing a near-infrared light-emitting diode of claim 1, wherein X and X' are different halogen element.

4. The method for manufacturing a near-infrared light-emitting diode of claim 1, wherein the ratio of methoxyactonitrile, dimethylformamide, and acetonitrile in said solvent is 1:3:2.

5. The method for manufacturing a near-infrared light-emitting diode of claim 1, wherein the mole values of said first powder and said second powder are identical.

6. The method for manufacturing a near-infrared light-emitting diode of claim 1, and further comprising a step of diluting said CsSnXX'$_2$ solution before said step of coating said CsSnXX'$_2$ solution on said substrate.

7. The method for manufacturing a near-infrared light-emitting diode of claim 6, wherein said step of diluting said CsSnXX'$_2$ solution is to dilute the concentration of said CsSnXX'$_2$ solution to 15~70 mg/ml.

8. The method for manufacturing a near-infrared light-emitting diode of claim 1, wherein said step of coating said CsSnXX'$_2$ solution on said substrate includes using spin coating, blade coating, or drop casting methods.

9. The method for manufacturing a near-infrared light-emitting diode of claim 8, wherein the spinning rate of said spin coating method is 2500~3500 rpm.

10. A method for manufacturing a near-infrared light-emitting diode comprising a light-emitting layer, characterized in that the formation of said light-emitting layer comprising steps of:
    mixing a first powder, a second powder, a third powder, and a solvent for forming a Cs(Sn$_y$Pb$_{1-y}$)X$_3$ solution, said first powder being CsX, said second powder being SnX$_2$, said third powder being PbX$_2$, X is a halogen element, and 0<y<1;
    coating said Cs(Sn$_y$Pb$_{1-y}$)X$_3$ solution on a substrate; and
    drying said Cs(Sn$_y$Pb$_{1-y}$)X$_3$ solution, and said Cs(Sn$_y$Pb$_{1-y}$)X$_3$ solution thus solidified and crystallized to Cs(Sn$_y$Pb$_{1-y}$)X$_3$ in the perovskite structure and forming said light-emitting layer.

11. The method for manufacturing a near-infrared light-emitting diode of claim 10, wherein the mole value of said first powder is equal to the sum of the mole values of said second powder and said third powder.

12. A method for manufacturing a near-infrared light-emitting diode comprising a light-emitting layer, characterized in that the formation of said light-emitting layer comprising steps of:
    mixing a first powder, a second powder, a third powder, and a solvent for forming a Cs(Sn$_y$Pb$_{1-y}$)X$_{3-z}$X'$_z$ solution, said first powder being CsX, said second powder being SnX$_2$ or SnX'$_2$, said third powder being PbX$_2$ or PbX'$_2$, X and X' are different halogen elements, and 0<y<1 and 0<z<2;
    coating said Cs(Sn$_y$Pb$_{1-y}$)X$_{3-z}$X'$_z$ solution on a substrate; and
    drying said Cs(Sn$_y$Pb$_{1-y}$)X$_{3-z}$X'$_z$ solution, and said Cs(Sn$_y$Pb$_{1-y}$)X$_{3-z}$X'$_z$ solution thus solidified and crystallized to Cs(Sn$_y$Pb$_{1-y}$)X$_{3-z}$X'$_z$ in the perovskite structure and forming said light-emitting layer.

13. A near-infrared light-emitting diode, comprising:
    a substrate;
    a hole transport layer, disposed on said substrate;
    a light-emitting layer, disposed on said hole transport layer, being Cs(Sn$_y$Pb$_{1-y}$)X$_{3-z}$X'$_z$ in the perovskite structure, X and X' are different halogen elements, and 0<y≤1 and 0≤z≤3;
    an electron transport layer, disposed on said light-emitting layer; and
    an electrode layer, disposed on said electron transport layer.

* * * * *